US011139236B2

(12) United States Patent
Tien et al.

(10) Patent No.: US 11,139,236 B2
(45) Date of Patent: Oct. 5, 2021

(54) SEMICONDUCTOR DEVICES AND METHODS OF FORMING THE SAME

(71) Applicant: Taiwan Semiconductor Manufacturing Co., Ltd., Hsinchu (TW)

(72) Inventors: Hsi-Wen Tien, Hsinchu County (TW); Wei-Hao Liao, Hsinchu (TW); Pin-Ren Dai, Hsinchu (TW); Hsin-Chieh Yao, Hsinchu (TW); Chih Wei Lu, Hsinchu (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/547,750

(22) Filed: Aug. 22, 2019

(65) Prior Publication Data
US 2021/0057334 A1    Feb. 25, 2021

(51) Int. Cl.
*H01L 23/522* (2006.01)
*H01L 21/768* (2006.01)
*H01L 21/311* (2006.01)

(52) U.S. Cl.
CPC .... *H01L 23/5226* (2013.01); *H01L 21/31144* (2013.01); *H01L 21/7684* (2013.01); *H01L 21/76802* (2013.01); *H01L 21/76877* (2013.01)

(58) Field of Classification Search
CPC ........ H01L 21/76229; H01L 21/76811; H01L 21/76877; H01L 21/76885; H01L 2221/1036; H01L 23/53295; H01L 21/76816; H01L 21/768; H01L 21/76829
See application file for complete search history.

(56) References Cited

U.S. PATENT DOCUMENTS

| 9,520,362 | B2 | 12/2016 | Lin et al. | |
| 9,716,032 | B2 | 7/2017 | Tang et al. | |
| 2004/0084780 | A1* | 5/2004 | Yew | H01L 21/76832 257/774 |
| 2009/0051033 | A1* | 2/2009 | Gosset | H01L 23/53295 257/751 |
| 2015/0179511 | A1* | 6/2015 | Hsieh | H01L 21/0277 438/675 |
| 2017/0194242 | A1* | 7/2017 | Huang | H01L 21/76832 |

* cited by examiner

*Primary Examiner* — Alia Sabur
(74) *Attorney, Agent, or Firm* — Haynes and Boone, LLP

(57) ABSTRACT

Semiconductor devices and methods of forming the same are provided. A method according to the present disclosure includes providing a workpiece including a metal feature in a first dielectric layer, an etch stop layer (ESL) over the metal feature, a second dielectric layer over the ESL, a third dielectric layer over the second dielectric layer, a patterned hard mask having a trench. The method further includes forming a via opening through the trench in the patterned hard mask, the second dielectric layer, the third dielectric layer, and the ESL to expose the metal feature, depositing a metal layer in the trench and the via opening to form a metal line and a metal contact via, respectively, and over the workpiece, removing the patterned hard mask between the metal line and the metal contact via, and depositing a fourth dielectric layer between the metal line and the metal contact via.

20 Claims, 12 Drawing Sheets

SEMICONDUCTOR DEVICES AND METHODS OF FORMING THE SAME

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, contacts of the MLI features are exhibiting increased contact resistance and impeding current flow, which presents performance, yield, and cost challenges. The first and/or second MLI layer that is closer to the active devices have the smallest line widths among all the MLI layers. It has been observed that edge rounding and low-K dielectric damages resulting from formation of via openings in the first/second MLI layers may result in shorting or increased parasitic capacitance. Accordingly, although existing contacts have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
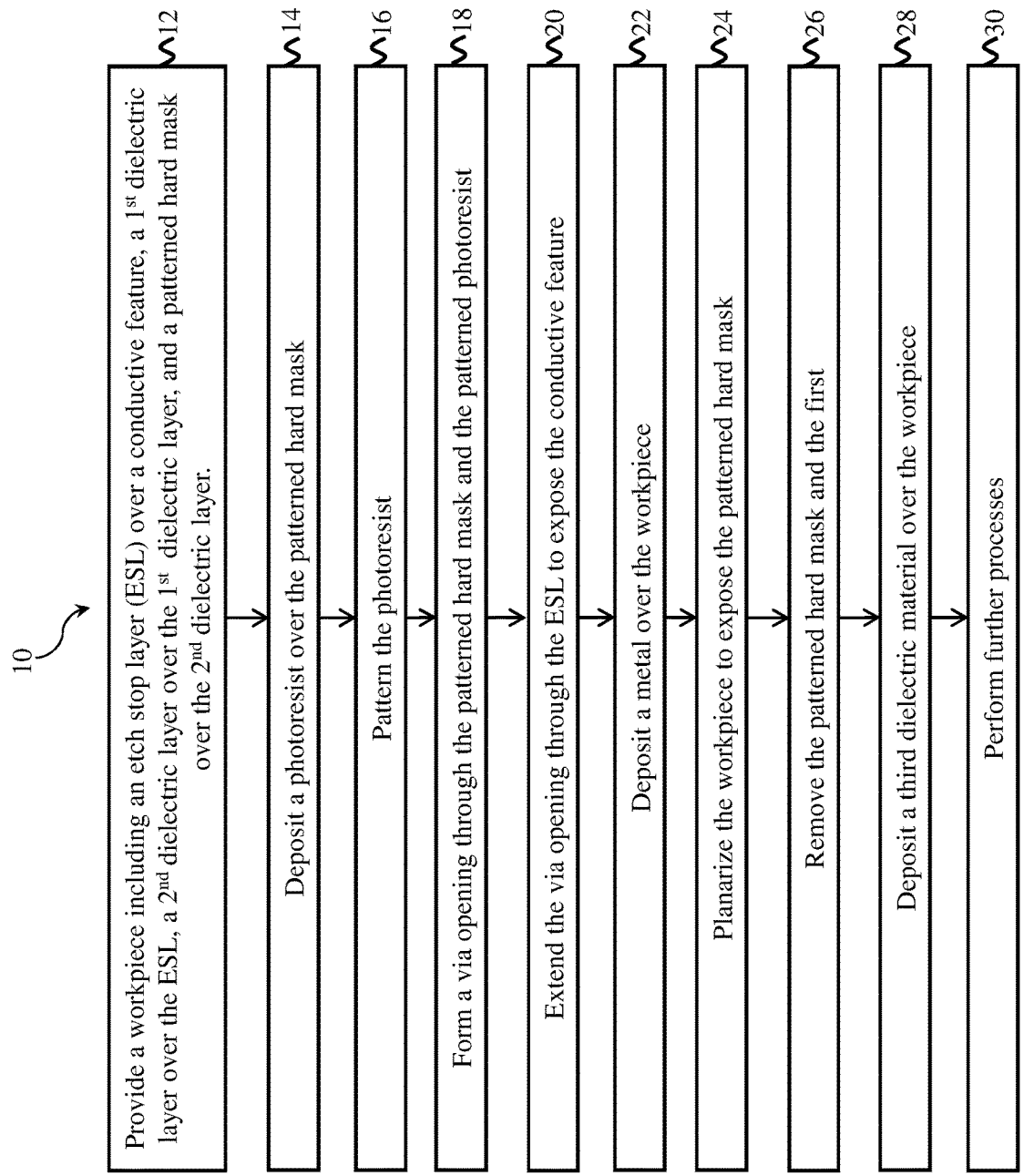
FIG. 1 is a flow chart of a method for fabricating an interconnect structure of an integrated circuit device according to various aspects of the present disclosure.

The present disclosure relates generally to integrated circuit (IC) devices, and more particularly, to interconnect structures of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

The present disclosure generally relates to BEOL processes directed at fabricating an MLI structure or an interconnect structure for planar IC devices and/or non-planar IC devices (for example, fin-like field effect transistors (FinFETs)). An MLI structure may include a plurality of conductive layers. Conventionally, when metal lines and metal contact vias are to be formed, trenches and via openings are first etched in layers of low-k dielectric material and then a metal is deposited to fill the trenches and via openings to form the metal lines and contact vias. These conventional methods, while being viable solutions to form metal lines and metal contact vias, have challenges. For examples, the low-k dielectric layers may lose their low-k quality after being etched with dry etchants and plasma. In addition, because the bottom surfaces of the trenches are not protected by any etching stop layer (or any layer with different etching properties) when via openings are being etched, edge rounding may be formed between via openings, resulting in increased parasitic capacitance or even shorting. Methods disclosed herein form an interconnect structure where metal lines and metal contact vias are separated by unetched low-k dielectric material and different low-k dielectric layers allow selective etching to avoid edge rounding. Different embodiments may have different advantages, and no particular advantage is required of any embodiment.

FIG. 1 is a flow chart of a method 10 for fabricating an interconnect structure of an integrated circuit (IC) device according to various aspects of the present disclosure. The method 10 includes blocks 12, 14, 16, 18, 20, 22, 24, 26, 28, and 30. Additional operations can be provided before, during, and after the method 10, and some operations described can be replaced, eliminated, or moved around for additional embodiments of the method 10.

Blocks of the method 10 of FIG. 1 may be better described in conjunction with FIGS. 2-10, 11A and 11B. FIGS. 2-10, 11A and 11B are fragmentary cross-sectional diagrammatic views of a workpiece 200 of an IC device at various fabrication stages of a method, such as method 10 of FIG. 1, according to various aspects of the present disclosure. Workpiece 200 can be included in a microprocessor, a memory, and/or other IC device. In some implementations, workpiece 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2-10, 11A and 11B have been simplified for the sake of clarity to better understand the inventive concepts of the present disclosure. Additional features can be added in workpiece 200, and some of the features described below can be replaced, modified, or eliminated in other embodiments of workpiece 200.

Figure 2:
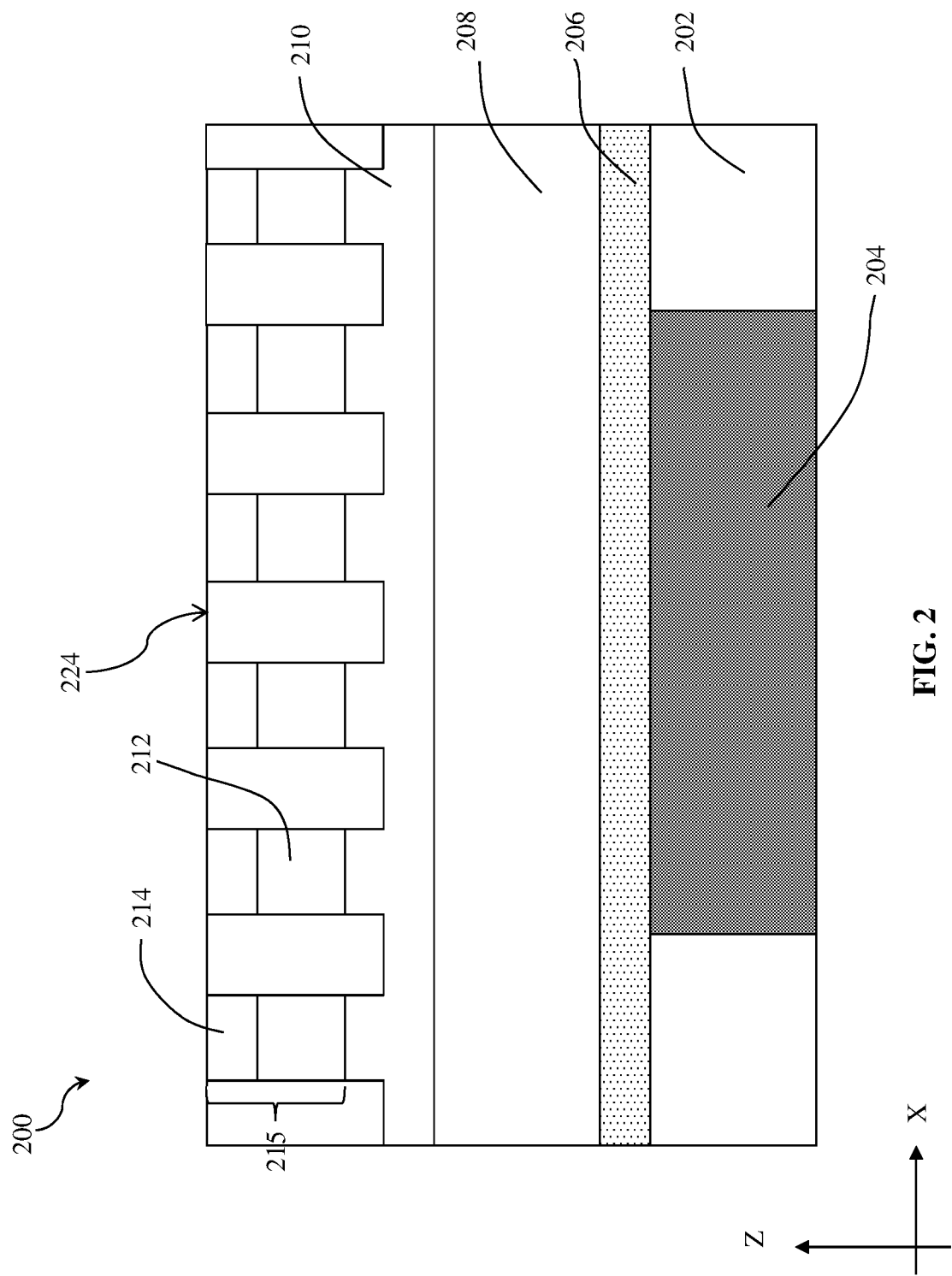
FIGS. 2-10, 11A and 11B are fragmentary cross-sectional diagrammatic views of an interconnect structure at various fabrication stages of a method, such as the method of FIG. 1, according to various aspects of the present disclosure.

Reference is made to FIGS. 1 and 2. The method 10 starts with block 12 where a workpiece 200 is provided. The workpiece 200 includes an etch stop layer (ESL) 206 over a conductive feature 204 embedded in a dielectric layer 202, a first dielectric layer 208 over the ESL 206, a second dielectric layer 210 over the first dielectric layer 208, and a patterned hard mask 215 over the second dielectric layer 210. In some examples, the conductive feature 204 may be a source/drain contact, a gate contact, or a conductive feature electrically coupled to a source/drain contact or a gate contact. In some embodiments represented in FIG. 2, the patterned hard mask 215 may include a first hard mask layer 212 and a second hard mask layer 214 different in composition from the first hard mask layer 212. In some embodiments, the conductive feature 204 may include a metal, such as copper (Cu), cobalt (Co), ruthenium (Ru), molybdenum (Mo), chromium (Cr), tungsten (W), manganese (Mn), rhodium (Rh), iridium (Jr), nickel (Ni), palladium (Pd), platinum (Pt), silver (Ag), gold (Au), aluminum (Al), and a combination thereof. The dielectric layer 202 may include silicon oxide or other suitable dielectric material. In some embodiments, the ESL 206 may include a dielectric material different from that of the dielectric layer 202 and the dielectric material forming the ESL may include silicon carbide (SiC), silicon oxide (SiO), silicon oxycarbide (SiOC), silicon nitride (SiN), silicon carbonitride (SiCN), silicon oxycarbonitride (SiOCN), aluminum oxynitride (AlON), aluminum oxide (AlO), titanium oxide (TiO), tantalum oxide (TaO), yttrium oxide (YO) other metal oxides, or combination thereof. The first dielectric layer 208 and the second dielectric layer 210 may be formed of SiC, SiO, SiOC, SiN, SiCN, SiON, SiOCN. It is noted that, for brevity and ease of description, stoichiometric ratios of all chemical formulae described in the present disclosure are omitted. It is also noted that, while some of the materials are referred to as compounds, they may refer to doped materials. For example, SiOC may refer to carbon-doped silicon oxide, SiCN may refer to carbon-doped silicon nitride, and SiOCN may refer to carbon doped and nitrogen-doped silicon oxide.

According to some embodiments of the present disclosure, while the selections of dielectric materials for the ESL 206, the first dielectric layer 208, and the second dielectric layer 210 overlap, the dielectric materials for them are selected such that they have different etch selectivities when subject to etching processes. In some examples, the ESL 206 may be formed of carbon-doped or nitrogen-doped silicon oxide and the first dielectric layer 208 may be formed of silicon oxide. In these examples, the ESL 206 may experience slower etching rate than the first dielectric layer 208 when both of them are subject to etching. Such etching rate different or selectivity allows an isotropic etching, such as dry etching, to etch through the first dielectric layer 208 and stop on or in the ESL 206. In other examples, the second dielectric layer 210 may be formed of carbon-doped or nitrogen-doped silicon oxide and the first dielectric layer 208 may be formed of silicon oxide. In these examples, the second dielectric layer 210 may experience slower etching rate than the first dielectric layer 208 when both of them are subject to etching. Such etching rate different or selectivity allows the first dielectric layer 208 under the second dielectric layer 210 to be protected by the second dielectric layer 210 and prevents edges of the first dielectric layer 208 from being etched to form rounded edges (i.e. edge rounding, or rounded shoulders). In some other examples, the materials for the ESL 206, the first dielectric layer 208, and the second dielectric layer 210 are selected such that the first dielectric layer 208 and the second dielectric layer 210 can be selectively dry etched without substantially etching the ESL 206. In these examples, the ESL 206 may be efficiently removed using wet etching.

In some embodiments, the patterned hard mask 215 may include titanium nitride (TiN), titanium oxide (TiO), tungsten, carbon-doped tungsten or tungsten carbide (WC), hafnium oxide (HfO), zirconium oxide (ZrO), zinc oxide (ZnO), zirconium titanium oxide (ZrTiO), other metal nitrides, other metal oxides, or combinations thereof. In embodiments represented in FIG. 2, the patterned hard mask 215 may include more than one layer, such as the first hard mask layer 212 and the second hard mask layer 214. In some instances, the first hard mask layer 212 may be different from the second hard mask layer 214 in terms of composition. It is noted that because the patterned hard mask 215 is to be moved and is not present in the final interconnect structure, the pattern hard mask 215 may be formed of conductive materials, such as metals or metal nitrides. In some embodiments, any non-conductive hard mask material may be used form the ESL 206. For example, the ESL 206 may also be formed of titanium oxide, hafnium oxide, zirconium oxide, zinc oxide, zirconium titanium oxide, or other metal oxides. In some embodiments, the patterned hard mask 215 may be formed by first depositing hard mask layers over the second dielectric layer 210 and then patterning the deposited hard mask layers. In some implementations, the patterning is performed using photolithography. For example, a photoresist (or a multi-layer photoresist) is formed over the deposited hard mask layer and the photoresist is exposed to a light source transmitted through or reflected from a mask. The exposed photoresist undergoes a chemical change and can be removed by a developer solution. The resulting photoresist is patterned and can be used as an etch mask to pattern the deposited hard mask layer.

The ESL 206, the first dielectric layer 208, the second dielectric layer 210, and the pattern hard mask layer may be formed using atomic layer deposition (ALD), chemical vapor deposition (CVD), physical vapor deposition (PVD), or spin-on coating, at a temperature between about 150° C. and about 400°. In some instances, the hard mask layer may be formed to a thickness between about 3 nm and about 50 nm, the first and second dielectric layers 208 and 210 may be formed to a thickness between about 3 nm and about 80 nm, and ESL 206 may be formed to a thickness between about 1 nm and about 100 nm.

Figure 3:
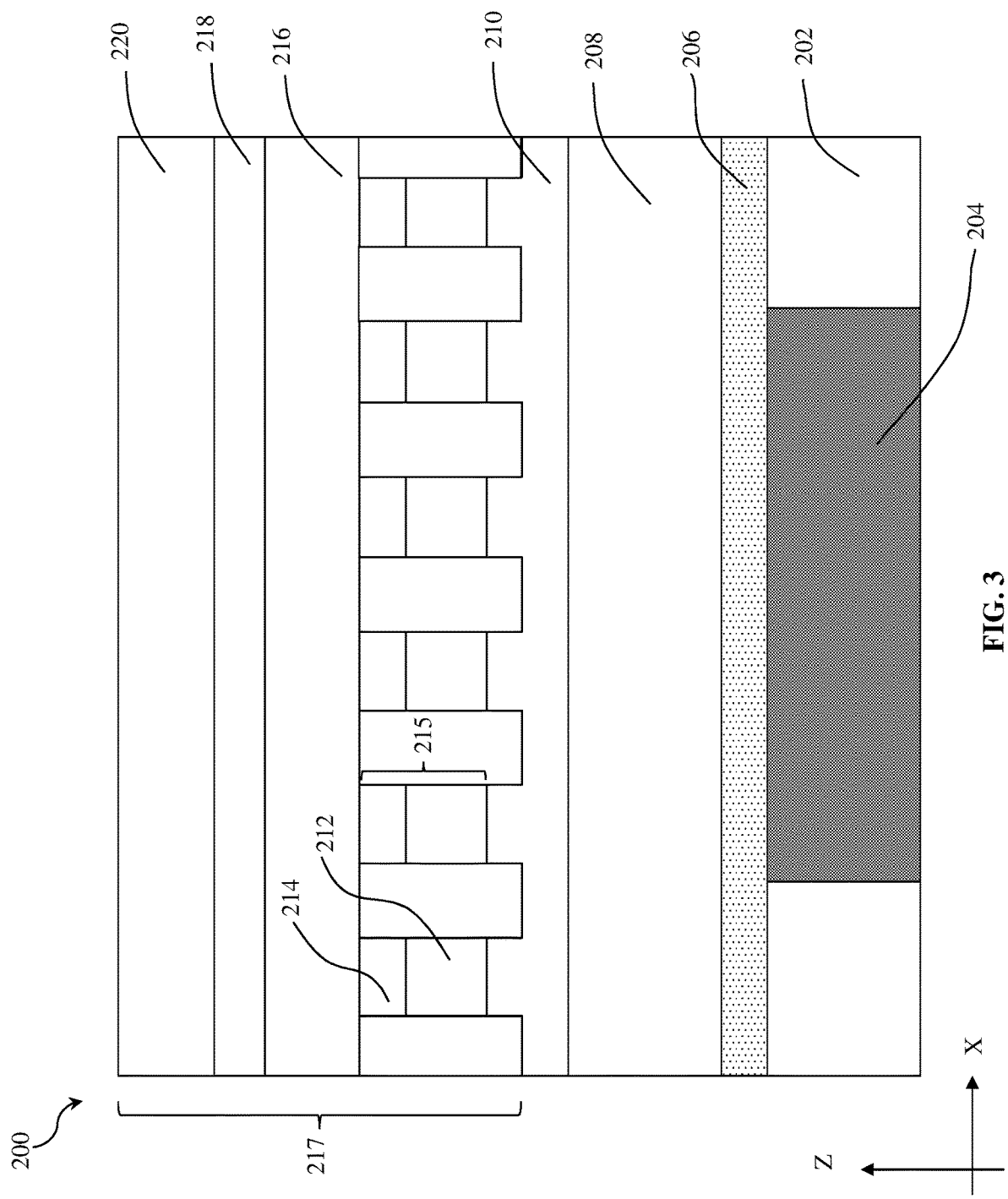

Referring now to FIGS. 1 and 3, the method 10 proceeds to block 14 where a photoresist layer 217 is deposited over the patterned hard mask 215. The photoresist layer 217 may be a single layer or a tri-layer. In embodiments illustrated in FIG. 3, the photoresist layer 217 is a tri-layer an includes a bottom layer 216, a middle layer 218, and a photosensitive layer 220. In some examples, the bottom layer 216 is a carbon-rich polymeric material that may be free of silicon. The middle layer 218 may include a silicon-containing layer designed to provide etching selectivity from the bottom layer 216. The photosensitive layer 220 is sensitive to radiation and can undergo chemical reaction when exposed to a light source, including, for example, a deep ultraviolet (DUV) light source, an extreme ultraviolet (EUV) light source, and an excimer laser, such as ArF laser or KrF laser.

Figure 4:
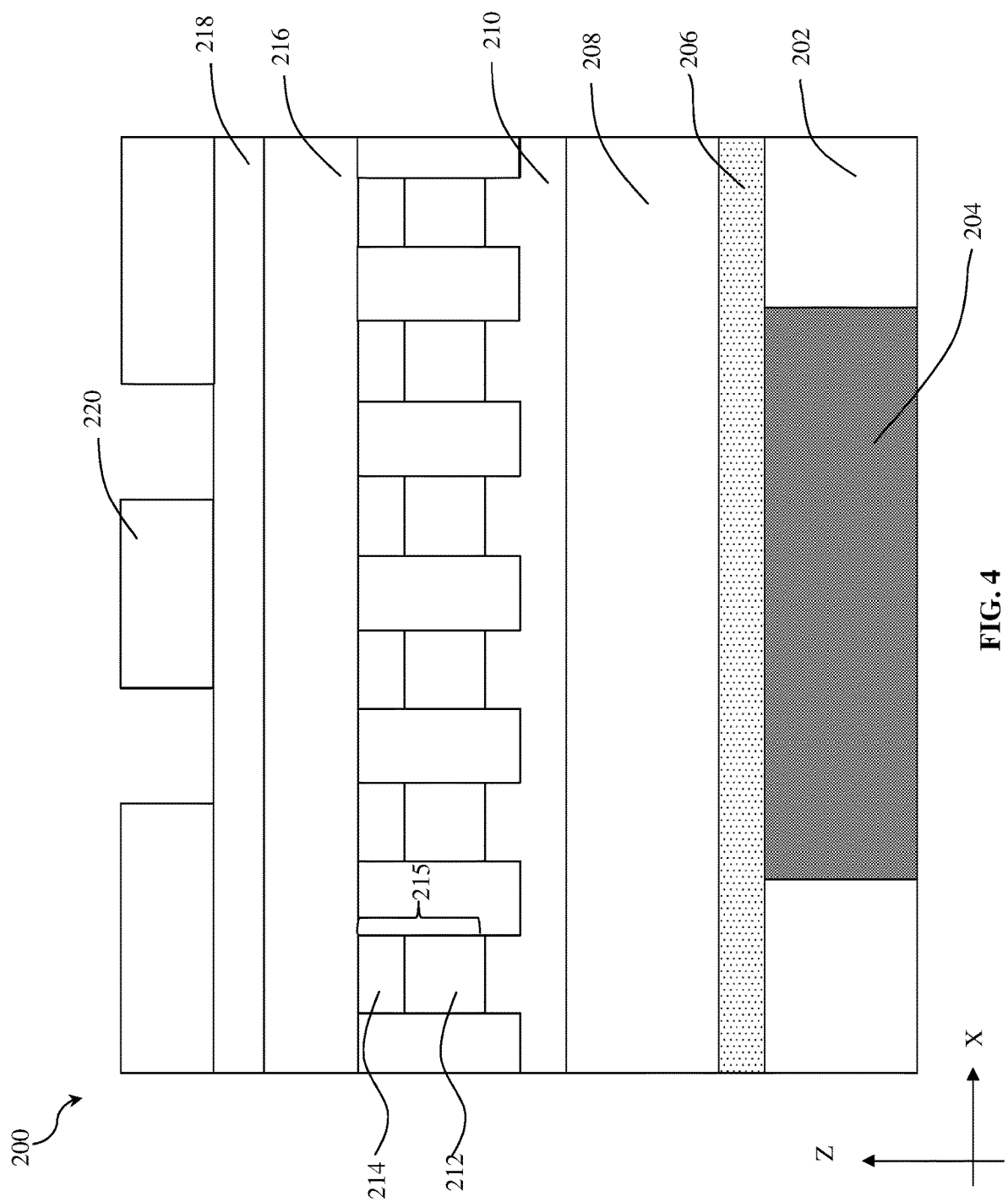

Referring now to FIGS. 1 and 4, the method 10 proceeds to block 16 where the photoresist layer 217 is patterned. In some embodiments, the photosensitive layer 220 is exposed to radiation through or reflected from a mask. In some implementations, the photosensitive layer 220 is pre-baked (or soft-baked) before exposure and is post-baked after exposure. After the photosensitive layer 220 is developed by a developer, the photosensitive layer 220 is patterned to form a patterned photosensitive layer 220. Then the middle layer 218 is etched using reactive ion etching (RIE), a fluorinated gas such as CHF3, and the patterned photosensitive layer 220 as an etch mask. After the middle layer 218 is patterned, the bottom layer 216 may be etched using RIE, an oxygen-containing gas such as oxygen, and the patterned photosensitive layer 220 and the patterned middle layer 218 as an etch mask. After the bottom layer 216 is patterned, the photoresist layer 217 is patterned at block 16.

Figure 5:
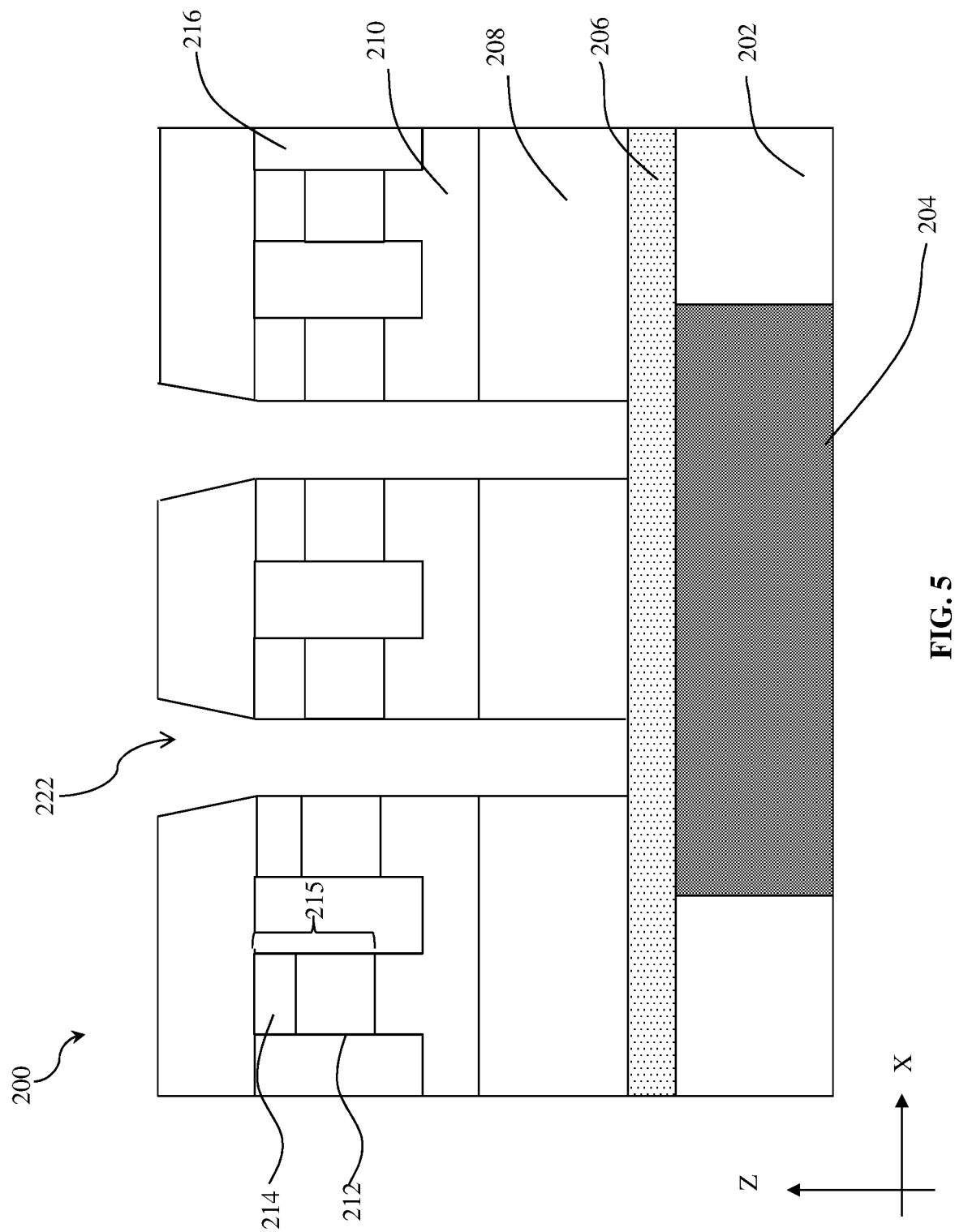

Referring now to FIGS. 1 and 5, the method 10 proceeds to block 18 where a via opening 222 is formed through the patterned hard mask 215 and the patterned photoresist layer 217 until the via opening reaches the ESL 206. In some embodiments, the via opening 222 extends through the first dielectric layer 208 and the second dielectric layer 210. In some implementations, the via opening 222 is formed using RIE with inductively coupled plasma (ICP) or capacitively coupled plasma (CCP) of etch gases, such as $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_3$, He, Ne, and Ar. In some embodiments, the RIE at block 18 is carried out at pressure between about 0.2 mTorr and about 120 mTorr. In some examples, the RIE at block 18 is performed at a temperature between about 0° C. and about 100° C. In some implementations, the RIE at block 18 is performed with a power between about 50 W and about 3000 W and a bias between about 0 volt and about 1200 volt. In embodiments represented in FIG. 5, the photosensitive layer 220 and the middle layer 218 may be removed at the conclusion of block 18. As described above, because the etching at block 18 is selective with respect to the first and second dielectric layers 208 and 210, ESL 206 may be substantially unetched.

Figure 6:
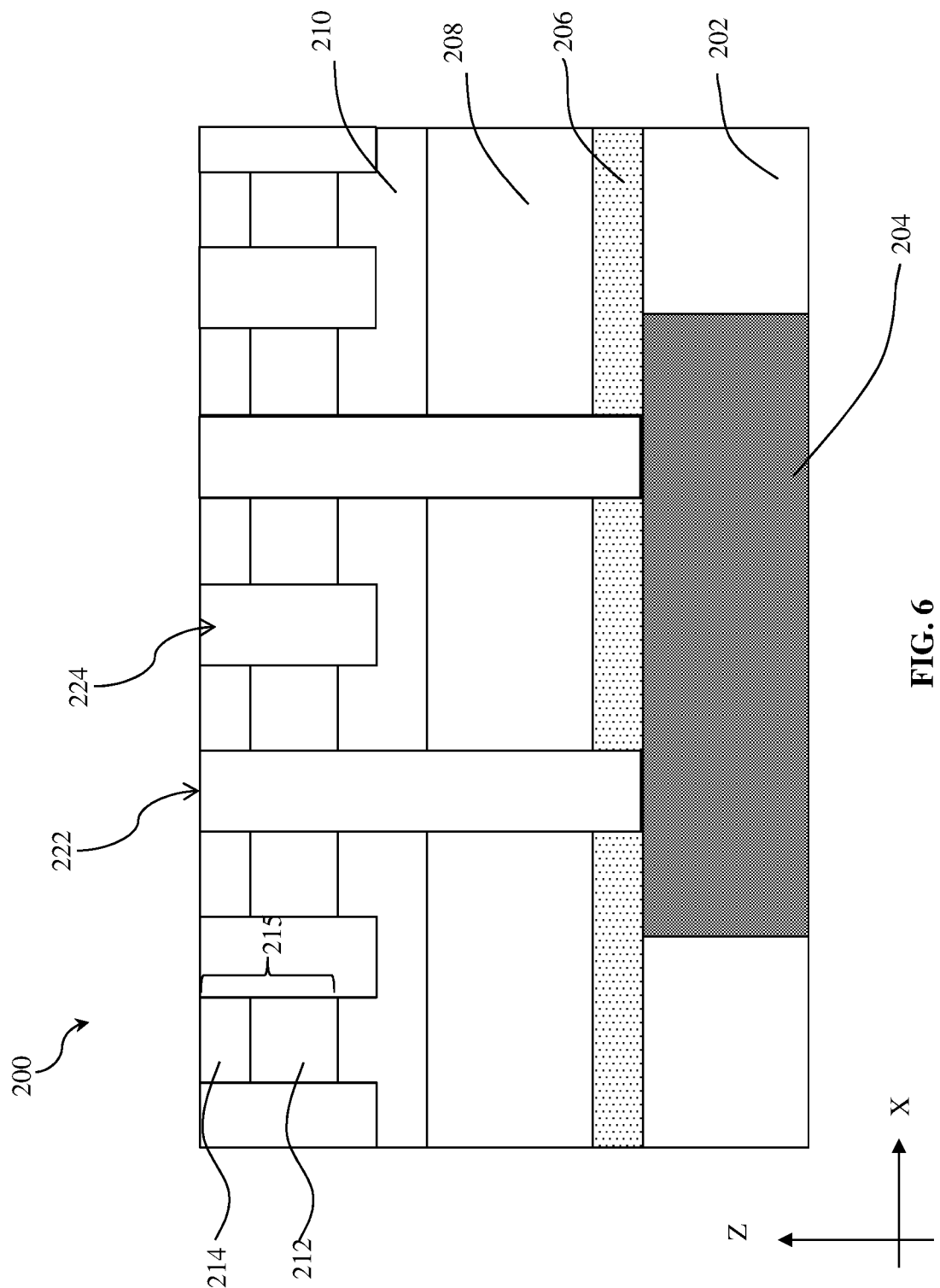

Referring now to FIGS. 1 and 6, the method 10 proceeds to block 20 where the via opening 222 is extended through the ESL 206 to expose the conductive feature 204 and the bottom layer 216 of the patterned photoresist layer 217 is removed. In some embodiments, the ESL 206 that is exposed in the via opening 222 at the conclusion of block 18 may be etched using RIE with ICP, CCP or remote plasma generated using etch gases such as $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_3$, He, Ne, and Ar, and/or a wet etch. In some embodiments, the RIE at block 20 is carried out at pressure between about 0.2 mTorr and about 120 mTorr. In some examples, the RIE at block 20 is performed at a temperature between about 0° C. and about 100° C. In some implementations, the RIE at block 20 is performed with a power between about 50 W and about 3000 W and a bias between about 0 volt and about 1200 volt. In some instances where the bottom layer 216 is not removed along with the etching of the ESL 206, the bottom layer 216 may be removed, for example, by ashing. After the bottom layer 216 is removed, the trenches 224 are exposed. In some implementations, the material of the ESL 206, the patterned hard mask 215, and the RIE process at block 20 may be selected such that the RIE process can selectively remove the ESL 206 exposed in the via opening 222 without substantially etching the patterned hard mask 215. In those implementations, the shape and spacing of the patterned hard mask 215 can be maintained after operations at block 20 to ensure shape and spacing of the metal lines and metal contact vias.

Figure 7:
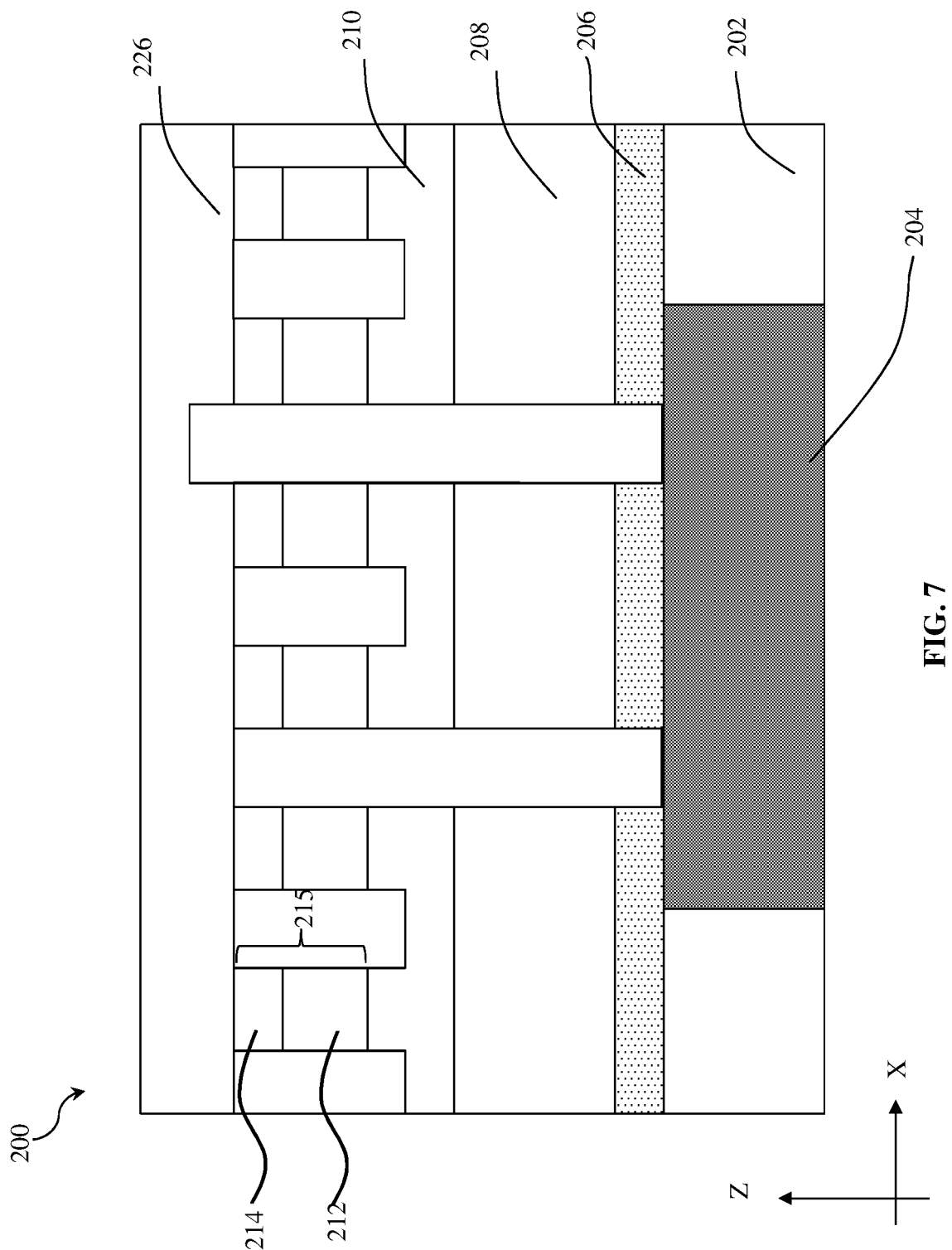

Referring now to FIGS. 1 and 7, the method 10 proceeds to block 22 where a metal 226 is deposited over the workpiece 200, including within the via opening 222 and the trench 224. In some embodiments, the metal 226 may include tantalum (Ta), tantalum nitride (TaN), titanium nitride (TiN), copper (Cu), cobalt (Co), ruthenium (Ru), molybdenum (Mo), iridium (Ir), or tungsten (W). In some embodiments, the metal 226 may be deposited using PVD, CVD, or ALD at a temperature between about 150° C. and about 400° C. In some implementations, the metal 226 may be formed to a thickness between about 1 nm and about 100 nm. In some instances, to protect the metal 226 from oxidation, a barrier layer may be formed over the workpiece 200, including over the sidewalls of the via opening 222 and the trench 224. The barrier layer may be formed using ALD or CVD. In these instances, the barrier layer may be form of metal (for example, W, Al, Ta, Ti, Ni, Cu, Co, other suitable metal, or combinations thereof), metal oxides, metal nitrides (for example, TiN and TaN), or combinations thereof.

Figure 8:
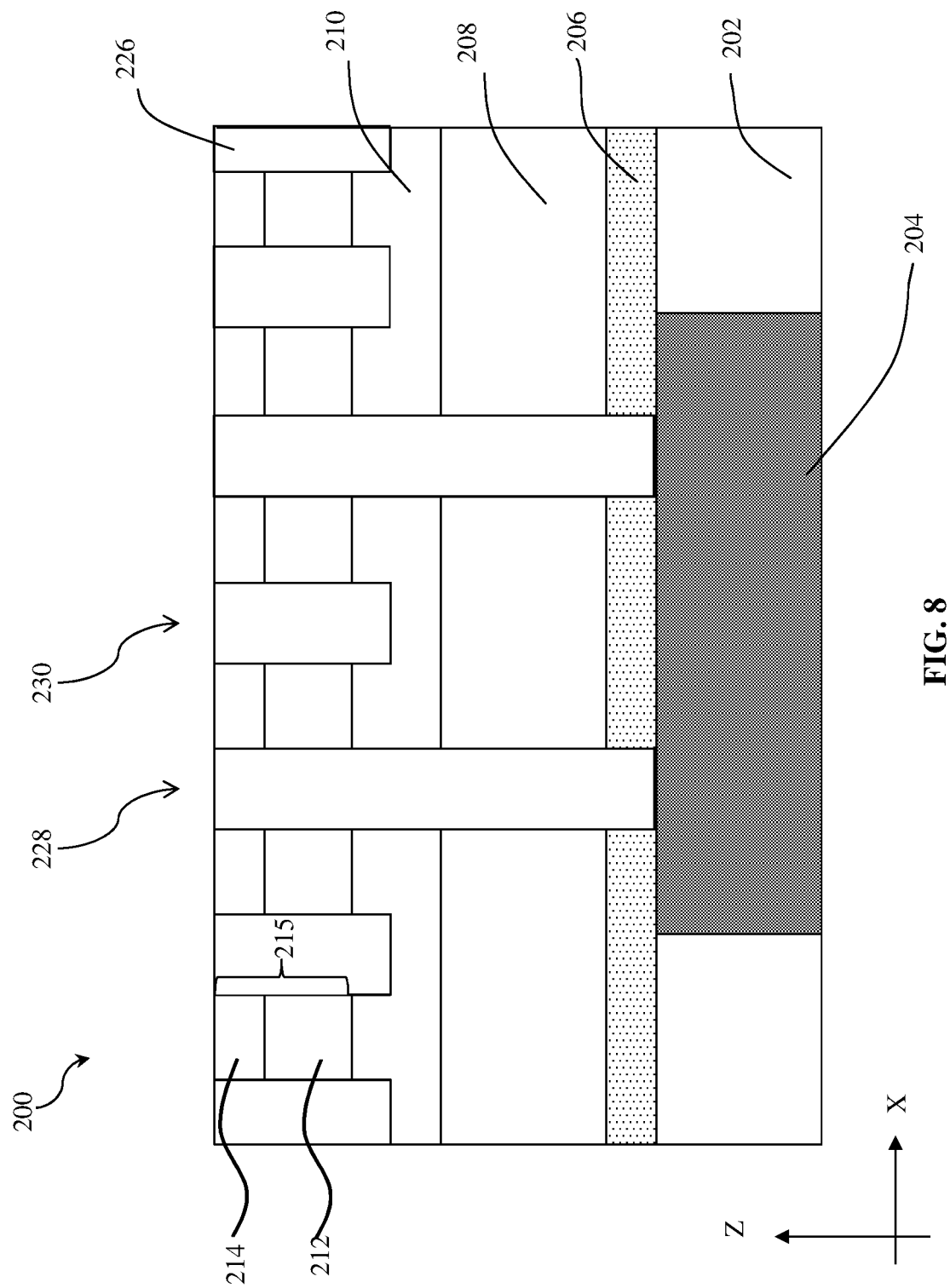

Referring now to FIGS. 1 and 8, the method 10 proceeds to block 24 where the workpiece 200 is planarized to expose top surfaces of the patterned hard mask 215. In some embodiments, the workpiece 200, including the deposited metal 226, is planarized by a suitable planarization technique, such as chemical mechanical polishing (CMP), until the patterned hard mask 215 is exposed. In some instances, in order to form a planar surface, the top surface of the patterned hard mask 215 is also planarized at block 24.

Figure 9:
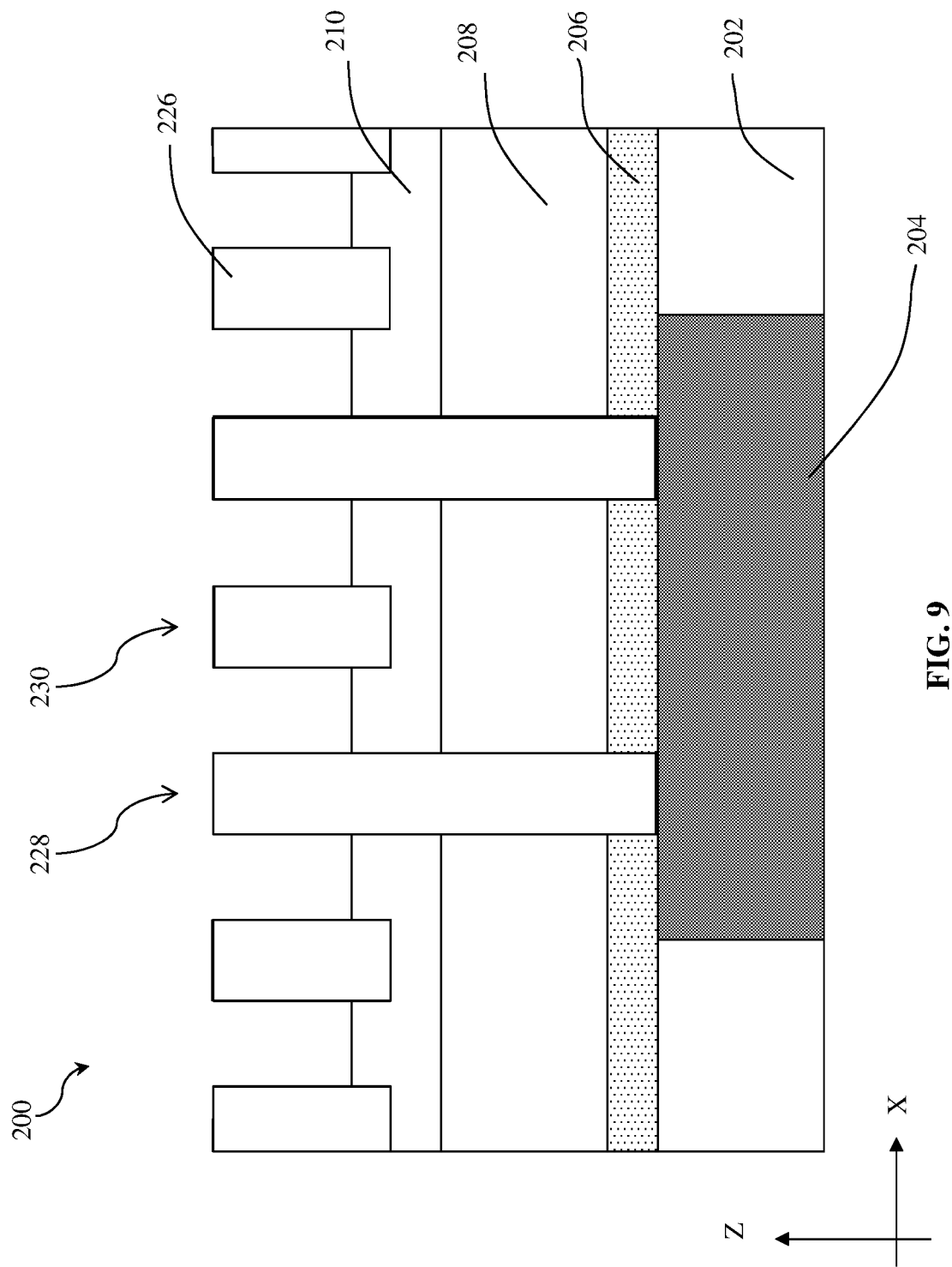
Figure 10:
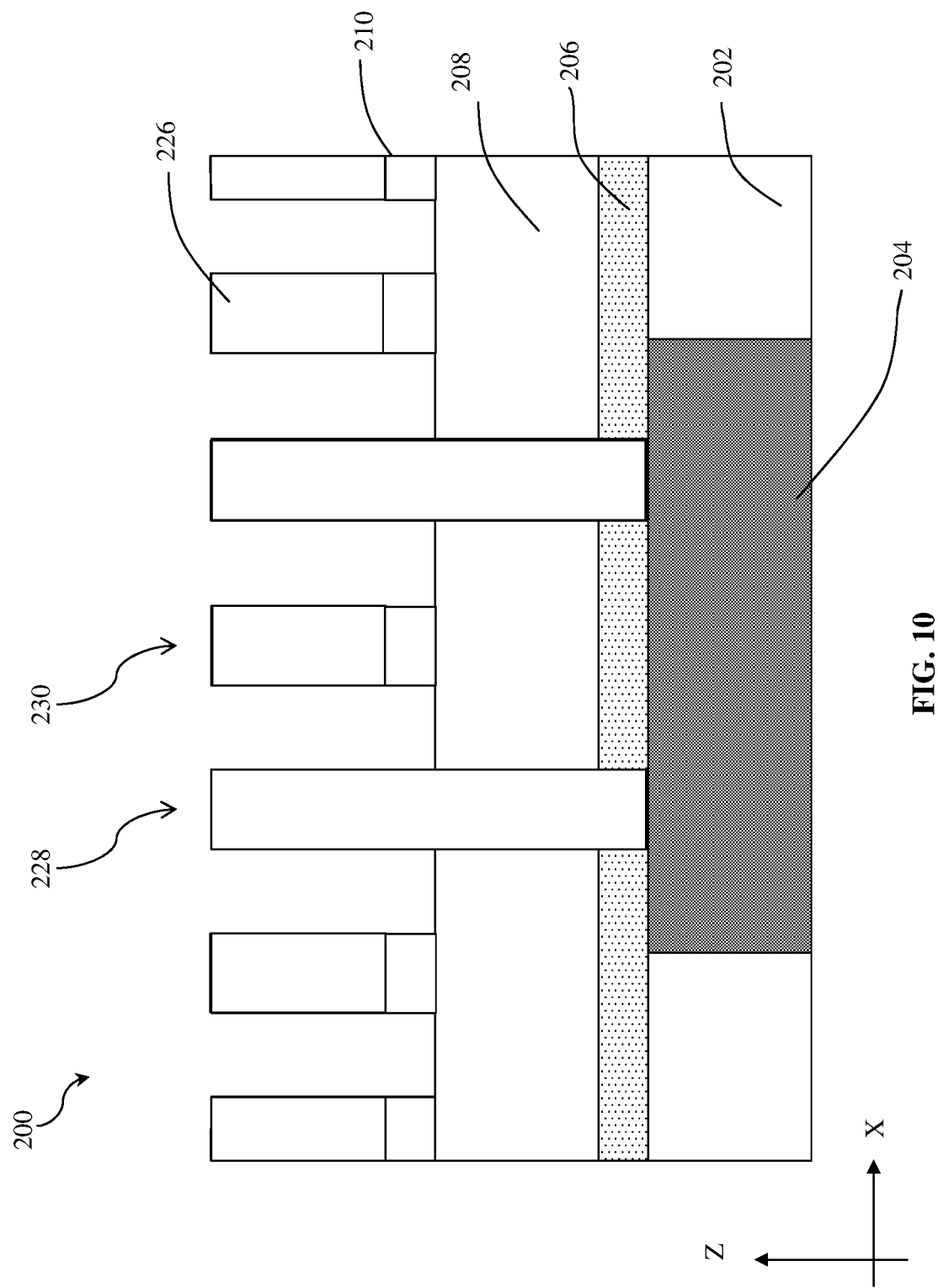

Referring now to FIGS. 1, 9 and 10, the method 10 proceeds to block 26 where the patterned hard mask 215 is removed. The patterned hard mask 215 may be removed by dry or wet etching. In embodiments where the patterned hard mask 215 is removed by dry etching, the patterned hard mask 215 may be etched using RIE with ICP, CCP or remote plasma generated using etch gases such as $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_3$, He, Ne, and Ar. In some embodiments, the RIE at block 26 is carried out at pressure between about 0.2 mTorr and about 120 mTorr. In some examples, the RIE at block 26 is performed at a temperature between about 0° C. and about 100° C. In some implementations, the RIE at block 26 is performed with a power between about 50 W and about 3000 W and a bias between about 0 volt and about 1200 volt. In some implementations, the part of the second dielectric layer 210 under the patterned hard mask 215 may be removed along with the patterned hard mask 215. In some other implementation, the part of the second dielectric layer 210 under the patterned hard mask 215 may not be removed along with the patterned hard mask 215 and a separate RIE process may be performed to remove the same. In still other embodiments, the part of the second dielectric layer 210 under the patterned hard mask 215 is not removed even if it is not removed along with the patterned hard mask 215. As illustrated in FIG. 10, in embodiments where the part of the second dielectric layer 210 under the patterned hard mask 215 is removed, the first dielectric layer 208 is exposed between a metal contact via 228 and a metal line 230. In those embodiments shown in FIG. 10, the part of the second dielectric layer 210 under the metal line 230 is not removed.

Figure 11A:
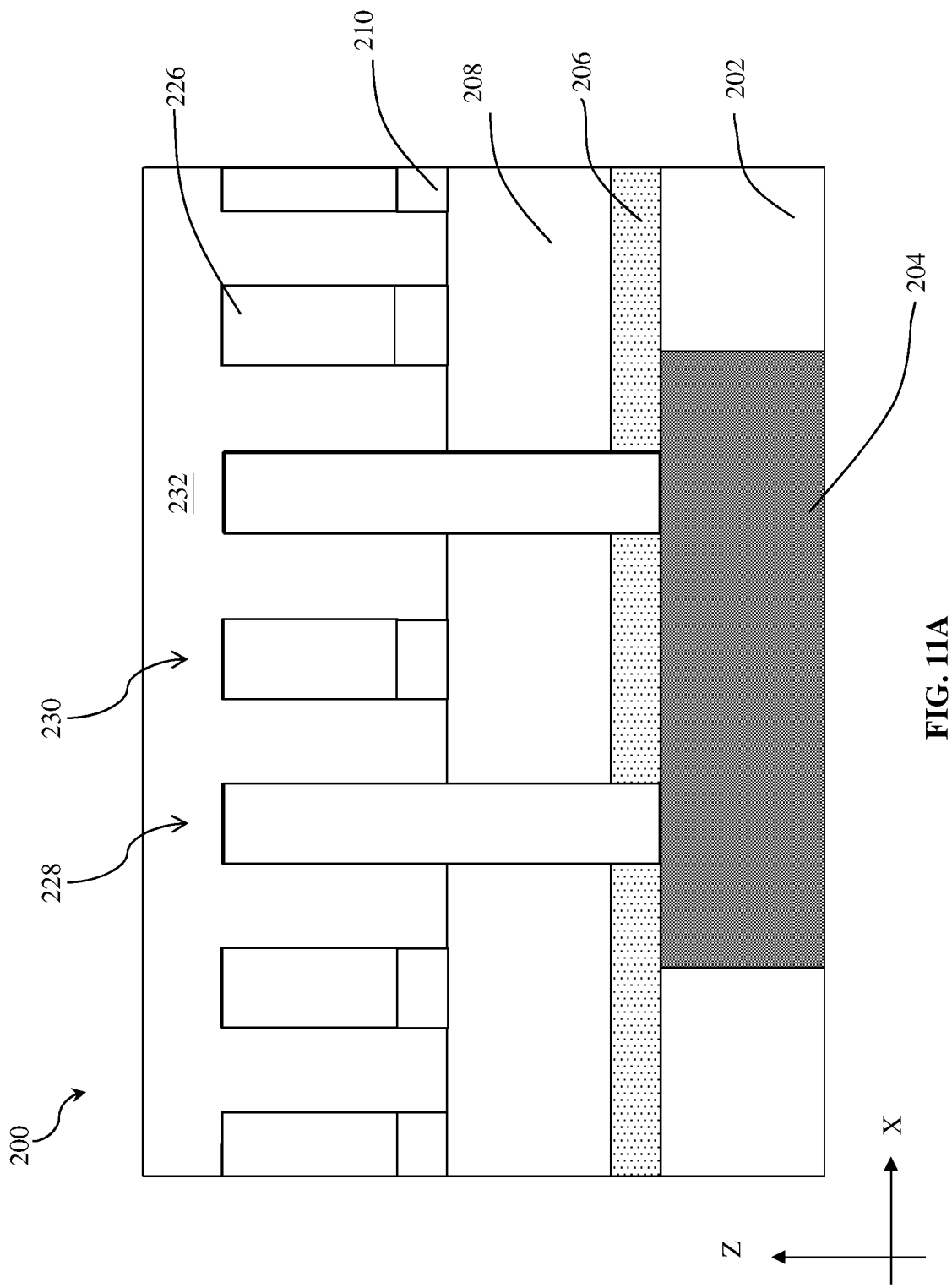
Figure 11B:
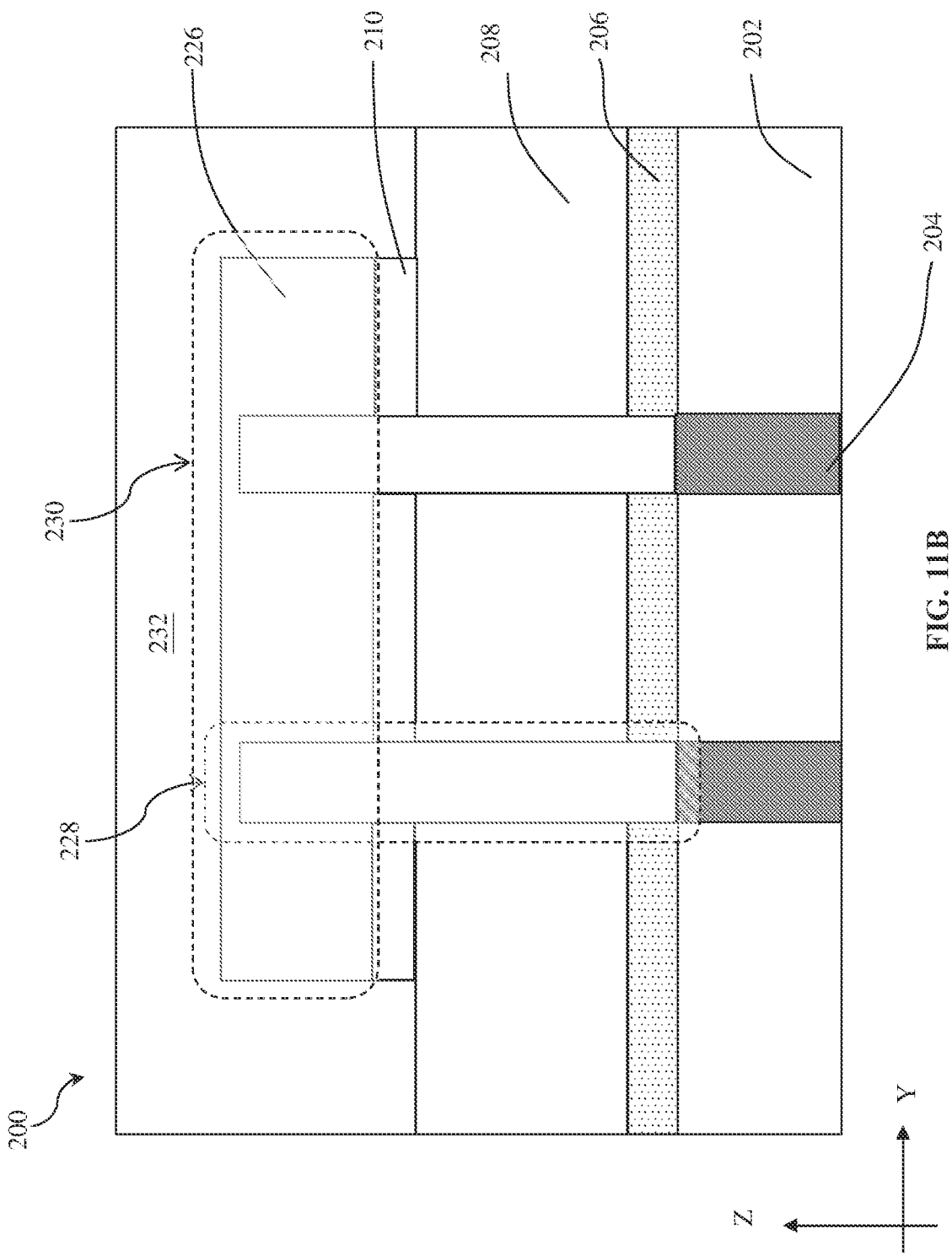

Referring now to FIGS. 1, 11A and 11B, the method 10 proceeds to block 28 where a third dielectric layer 232 is deposited over the workpiece 200, including between the metal contact via 228 and the metal line 230. In some embodiments, the third dielectric layer 232 includes a low-k material such as SiC, SiO, SiOC, SiN, SiCN, SiON, SiOCN, or a combination thereof. It is noted that because the third dielectric layer 232 does not undergo etching by plasma or etchant, the low-k property of third dielectric layer 232 is not adulterated by plasma or gaseous etchant in the etching process. In some of the conventional processes, one or more low-k dielectric layers are etched using RIE techniques to form via opening and trenches for metal lines and metal contact vias. In those conventional processes, the low-k property of the one or more low-k dielectric layers may deteriorate during etching. For example, the etchant, such as $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_3$, He, Ne, and Ar, may react with the one or more low-k dielectric layers and form non low-k compound or doped regions on sidewalls and top-facing surfaces of the one or more low-k dielectric layers. By depositing the third dielectric layer 232 anew without etching, as shown in FIG. 11A, the methods of the present disclosure can form interconnect structures with good low-k dielectric material between metal lines/metal contact vias. Consequently, the methods of the present disclosure can form interconnect structures with reduced parasitic capacitance.

Reference is now made to FIG. 11B, which is a cross-sectional view of the workpiece 200 in FIG. 11A along a different direction. FIG. 11A, like FIG. 2-10, is a cross-sectional view of the workpiece 200 along the X direction and FIG. 11B is a cross-sectional view of the workpiece 200 along the Y direction, perpendicular to the X direction. As shown in FIG. 11B, the metal contact via 228 illustrated in FIG. 11A includes a portion extending into the metal line 230 and the metal contact via 228 also includes a portion that extend through the second dielectric layer 210, the first dielectric layer 208, the ESL 206, and in contact with the conductive feature 204. When the via opening 222 is formed at block 18, the via opening 222 is not just etched through the first dielectric layer 208 but also the second dielectric layer 210. By selecting different dopants to impart different etching selectivities into the first and second dielectric layers 208 and 210, the second dielectric layer 210 can be made to etch more slowly than the first dielectric layer 208 and function as an etching stop layer for the first dielectric layer 208 to prevent or alleviate edge rounding in the first dielectric layer 208.

Referring now to FIG. 1, the method 10 proceeds to block 30 where further processes are performed. Such further processes may include, for example, formation of additional layers of interconnect structures, which may include forming more dielectric layers over the workpiece 200, etching trenches and via openings in these dielectric layers, depositing metal layers in these trenches and via openings, and performing CMP processes to remove excess metal layers.

In an embodiment, the method 10 proceeds from block 12 to block 30 in the order specified in FIG. 1. This embodiment of method 10 includes several features. For example, operations at block 22 are performed before those at block 26. That is, the metal 226 is deposited before the patterned hard mask 215 is removed. Because the patterned hard mask 215 would be covered by the metal 226 at block 26, the workpiece 200, including the metal 226 deposited over the workpiece 200, the workpiece 200 needs to be planarized at block 24 before the patterned hard mask 215 can be removed. For another example, operations at block 28 are performed after the metal 226 is deposited over the workpiece 200 at block 22 and the patterned hard mask 215 between the metal lines and metal contact vias are removed at block 26. That is, the low-k third dielectric layer 232 is deposited between the metal lines and metal contact vias after the metal lines and metal contact vias are formed. In some other embodiments, some operations in the method 10 can be replaced, eliminated, or moved around, provided that method 10 includes at least one of the features described above.

The methods of the present disclosure, such as method 10, may form an interconnect structure in the workpiece 200 shown in FIGS. 11A and 11B. The metal lines, such as the metal line 230, are disposed over the first dielectric layer 208 and the second dielectric layer 210 is disposed between the first dielectric layer 208 and the metal line 230. Besides extending between the metal line 230 and the metal contact via 228, the third dielectric layer 232 also extends between the second dielectric layer 210 and the metal contact via 228. The third dielectric layer 232 is deposited after the metal line 230 and the metal contact via 228 are formed and its low-k property is not adulterated by etching, for example, reaction with gaseous etchants and plasma. Because of the use of the second dielectric layer 210 as an etch stop layer for the first dielectric layer 208, the interconnect structure in the workpiece 200 has little or no edge rounding adjacent in the first dielectric layer 208 adjacent the metal contact via 228.

Embodiments of the present disclosure provide advantages. The present disclosure provides methods, such as method 10, to form an interconnect structure with unadulterated/unetched low-k dielectric layer to reduce parasitic capacitance. Additionally, by having multiple low-k dielectric layers and allowing one low-k dielectric layer to serve as an etch stop layer for another underlying low-k dielectric layer, methods of the present disclosure prevent edge rounding of the low-k dielectric layer adjacent metal contact vias, thus increasing the process window and yield.

The present disclosure provides for many different embodiments. In one embodiment, a method is provided. The method includes providing a workpiece including a metal feature in a first dielectric layer, an etch stop layer (ESL) over the metal feature, a second dielectric layer over the ESL, a third dielectric layer over the second dielectric layer, a patterned hard mask having a trench; forming a via opening through the trench in the patterned hard mask, the second dielectric layer, the third dielectric layer, and the ESL to expose the metal feature; depositing a metal layer in the trench and the via opening to form a metal line and a metal contact via, respectively, and over the workpiece; removing the patterned hard mask between the metal line and the metal contact via; and depositing a fourth dielectric layer between the metal line and the metal contact via.

In some embodiments, the method further includes before the removing of the patterned hard mask, planarizing the deposited metal layer to expose the patterned hard mask. In some embodiments, the removing of the patterned hard mask is after the depositing the metal layer over the patterned hard mask. In some implementations, the method further includes removing the third dielectric layer under the patterned hard mask. In some embodiments, the fourth dielectric layer between the metal line and the metal contact via is not subject to etching. In some embodiments, the second dielectric layer is different from the third dielectric layer and the second dielectric layer is different from the ESL. In some implementations, the patterned hard mask is different from the ESL in terms of composition.

In another embodiment, a method is included. The method includes providing a workpiece including a metal feature in a first dielectric layer, an etch stop layer (ESL) over the metal feature, a second dielectric layer over the ESL, a third dielectric layer, and a patterned hard mask having a trench; forming a via opening through the trench in the patterned hard mask, the second dielectric layer, the third dielectric layer, and the ESL to expose the metal feature; and depositing a metal layer over the patterned hard mask and in the via opening such that the metal layer is in electrical communication with the metal feature.

In some embodiments, the method further includes planarizing the deposited metal layer to expose the patterned hard mask; and removing the patterned hard mask. In some embodiments, the method further includes removing the third dielectric layer under the patterned hard mask. In some implementations, the removing of the patterned hard mask is after the depositing the metal layer over the patterned hard mask. In some implementations, the method further includes depositing a fourth dielectric layer over the metal layer. In those embodiments, the fourth dielectric layer is in contact with the second dielectric layer. In some instances, the fourth dielectric layer is in contact with the third dielectric layer under the metal layer. In some implementations, the second dielectric layer is different from the third dielectric layer and the second dielectric layer is different from the ESL.

In still another embodiment, a semiconductor device is provided. The semiconductor device includes a metal feature disposed in a first dielectric layer; an etch stop layer (ESL) over the metal feature; a second dielectric layer over the ESL; a metal line over the second dielectric layer; a metal contact via adjacent to the metal line; and a third dielectric layer between the metal line and the second dielectric layer. The metal contact via extends through the second dielectric layer, the third dielectric layer, and the ESL and is in electrical contact with the metal feature.

In some embodiments, the second dielectric layer is different from the third dielectric layer and the second dielectric layer is different from the ESL. In some embodiments, the semiconductor device further includes a fourth dielectric layer between the metal line and the metal contact via. In some implementations, the fourth dielectric layer comprises a low-k dielectric material. In some instances, the fourth dielectric layer is different from the second dielectric layer and the third dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a workpiece including a metal feature in a first dielectric layer, an etch stop layer (ESL) over the metal feature, a second dielectric layer over the ESL, a third dielectric layer over the second dielectric layer, a patterned hard mask disposed over the third dielectric layer and having a first trench and a second trench;
forming a via opening through the first trench in the patterned hard mask, the second dielectric layer, the third dielectric layer, and the ESL to expose the metal feature;
depositing a metal layer in the second trench and the via opening to form a metal line in the second trench and a metal contact via in the via opening over the workpiece;
removing the patterned hard mask between the metal line and the metal contact via, wherein the removing comprises removing a first portion of the third dielectric layer to expose the second dielectric layer, wherein the removing does not remove a second portion of the third dielectric layer disposed between the metal line and the second dielectric layer; and
depositing a fourth dielectric layer between the metal line and the metal contact via.

2. The method of claim 1, further comprising:
before the removing of the patterned hard mask, planarizing the deposited metal layer to expose the patterned hard mask.

3. The method of claim 1, wherein the removing of the patterned hard mask is after the depositing the metal layer over the patterned hard mask.

4. The method of claim 1, wherein after the depositing of the fourth dielectric layer, the fourth dielectric layer is in contact with the metal line, the metal contact via, the second dielectric layer, and the second portion of the third dielectric layer.

5. The method of claim 1, wherein the fourth dielectric layer between the metal line and the metal contact via is not subject to etching.

6. The method of claim 1, wherein the second dielectric layer is different from the third dielectric layer and the second dielectric layer is different from the ESL.

7. The method of claim 1, wherein the patterned hard mask is different from the ESL in terms of composition.

8. A method comprising:
providing a workpiece including a metal feature in a first dielectric layer, an etch stop layer (ESL) over the metal feature, a second dielectric layer over the ESL, a third dielectric layer, and a patterned hard mask having a first trench and a second trench, wherein a first portion of the third dielectric layer is disposed under the patterned hard mask and a second portion of the third dielectric layer is exposed in the second trench;

forming a via opening through the first trench in the patterned hard mask, the second dielectric layer, the third dielectric layer, and the ESL to expose the metal feature;

depositing a metal layer over the patterned hard mask, in the second trench and in the via opening such that the metal layer is in electrical communication with the metal feature;

planarizing the deposited metal layer to expose the patterned hard mask to form a metal contact via in the via opening and a metal line in the second trench; and removing the patterned hard mask and the first portion of the third dielectric layer wherein the second portion of the third dielectric layer is disposed between the metal line and the second dielectric layer.

9. The method of claim 8, wherein the ESL comprises titanium oxide, hafnium oxide, zirconium oxide, zinc oxide, or zirconium titanium oxide.

10. The method of claim 8, wherein the removing exposes a portion of the second dielectric layer.

11. The method of claim 8, wherein the removing of the patterned hard mask is after the depositing the metal layer over the patterned hard mask.

12. The method of claim 8, further comprising:
depositing a fourth dielectric layer over the metal layer.

13. The method of claim 12, wherein the fourth dielectric layer is in contact with the second dielectric layer.

14. The method of claim 12, wherein the fourth dielectric layer is in contact with the second portion of the third dielectric layer under the metal layer.

15. The method of claim 8, wherein the second dielectric layer is different from the third dielectric layer and the second dielectric layer is different from the ESL.

16. A semiconductor device, comprising:
a metal feature disposed in a first dielectric layer;
an etch stop layer (ESL) over the metal feature;
a second dielectric layer over the ESL;
a metal line over the second dielectric layer;
a metal contact via adjacent to the metal line;
a third dielectric layer between the metal line and the second dielectric layer; and
a fourth dielectric layer disposed between the metal line and the metal contact via,
wherein the metal contact via extends through the second dielectric layer, the third dielectric layer, and the ESL and is in electrical contact with the metal feature,
wherein the ESL comprises titanium oxide, hafnium oxide, zirconium oxide, zinc oxide, or zirconium titanium oxide,
wherein the fourth dielectric layer is in contact with the metal line, the second dielectric layer, the third dielectric layer, and the metal contact via.

17. The semiconductor device of claim 16, wherein the second dielectric layer is different from the third dielectric layer and the second dielectric layer is different from the ESL.

18. The semiconductor device of claim 16, further comprising a fourth dielectric layer does not undergo any etch processes.

19. The semiconductor device of claim 18, wherein the fourth dielectric layer comprises a low-k dielectric material.

20. The semiconductor device of claim 18, wherein the fourth dielectric layer is different from the second dielectric layer and the third dielectric layer.

* * * * *